US006738939B2

(12) United States Patent
Udawatta et al.

(10) Patent No.: US 6,738,939 B2
(45) Date of Patent: May 18, 2004

(54) METHOD AND APPARATUS FOR FAULT TOLERANT AND FLEXIBLE TEST SIGNATURE GENERATOR

(75) Inventors: Kapila B. Udawatta, Folsom, CA (US); Anthony Babella, Salida, CA (US)

(73) Assignee: Intel Corporation, Santa Clara, CA (US)

( * ) Notice: Subject to any disclaimer, the term of this patent is extended or adjusted under 35 U.S.C. 154(b) by 358 days.

(21) Appl. No.: 09/862,407

(22) Filed: May 21, 2001

(65) Prior Publication Data

US 2002/0174393 A1 Nov. 21, 2002

(51) Int. Cl.[7] .............................................. G01R 31/28
(52) U.S. Cl. ...................... 714/726; 714/738
(58) Field of Search ................. 714/736, 726, 714/724, 733, 732, 729, 738; 370/389

(56) References Cited

U.S. PATENT DOCUMENTS

| | | | | |
|---|---|---|---|---|
| 4,503,537 A | * | 3/1985 | McAnney | 714/736 |
| 5,329,533 A | * | 7/1994 | Lin | 714/726 |
| 5,331,643 A | * | 7/1994 | Smith | 714/726 |
| 5,790,561 A | * | 8/1998 | Borden et al. | 714/724 |
| 5,844,917 A | | 12/1998 | Salem et al. | |
| 5,930,270 A | | 7/1999 | Forlenza et al. | |
| 5,991,909 A | | 11/1999 | Rajski et al. | |
| 6,021,514 A | * | 2/2000 | Koprowski | 714/733 |
| 6,199,184 B1 | * | 3/2001 | Sim | 714/732 |
| 6,219,811 B1 | * | 4/2001 | Gruetzner et al. | 714/726 |
| 6,496,503 B1 | * | 12/2002 | Plissier et al. | 370/389 |
| 6,516,432 B1 | * | 2/2003 | Motika et al. | 714/732 |
| 6,557,129 B1 | * | 4/2003 | Rajski et al. | 714/729 |

FOREIGN PATENT DOCUMENTS

| | | |
|---|---|---|
| JP | 00 352576 | 12/2000 |
| WO | WO 01/33237 A1 | 5/2001 |

OTHER PUBLICATIONS

Cogswell et al, IBM Corp., "An Automatic Validation Methodolgy for Logic BIST in High Performance VLSI Design", pp. 473–478.

* cited by examiner

*Primary Examiner*—David Ton
(74) *Attorney, Agent, or Firm*—Michael J. Nesheiwat

(57) ABSTRACT

An apparatus with a generator to generate a pattern and multiple scan chains configured to receive the pattern from the generator. Multiple signature registers coupled to the scan chains, to receive an output of at least one of scan chains during a mode of the integrated device.

10 Claims, 2 Drawing Sheets

METHOD AND APPARATUS FOR FAULT TOLERANT AND FLEXIBLE TEST SIGNATURE GENERATOR

BACKGROUND OF THE INVENTION

1. Field of the Invention

The present invention relates to design for test improvements, and specifically to a method and apparatus for fault tolerant and flexible test signature generator within an integrated device.

2. Description of the Related Art

Modern integrated circuit (IC) devices include large numbers of gates on a single semiconductor chip, with these gates interconnected so as to perform multiple and complex functions. The fabrication of an IC incorporating such Very Large Scale Integration (VLSI) must be error free, as a manufacturing defect may prevent the IC from performing all of the functions that an IC is designed to perform. Such demands require verification of the design of the IC and also various types of electrical testing after the IC is manufactured.

However, as the complexity of the IC increases, so does the cost and complexity of verifying and electrically testing each of the devices in the IC. Electrical testing ensures that each node in a VLSI circuit functions properly. Therefore, each node needs to individually, and in conjunction with the other node in the IC, function properly in all possible combinations of operations. Typically, electrical testing is performed by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular node. For complex circuitry, this may involve a large number of test vectors and, accordingly, a long test time.

One way to address this problem is through design for test (DFT). DFT methods utilize various test circuits. One type of test circuit is a scan path or a scan loop in the logic circuit. A scan path or scan loop comprises of a chain of synchronously clocked master/slave latches (or scan flip flops), each of which is connected to a particular node in the logic circuit. Typical scan circuit designs involve one or more separate scan paths or scan loops. The scan latches can be loaded with a serial data stream of scan vectors that set the logic circuit nodes to a predetermined state. The logic circuit then can be operated in normal fashion and the result of the operation is stored in its respective latch. A scan out operation serially unloads the contents of the latches and the result of the test operation at the associated nodes is analyzed for improper node operation.

A typical circuit for verifying functionality of the nodes is utilizing a single multiple input signature register (MISR) to receive the outputs of scan chains. Also, additional logic is needed for initializing the integrated device to prevent signature corruption due to un-initialized nodes. However, this requires significant simulation and cost overhead due to the additional logic and design simulation to insure all the nodes are initialized. Also, any scan chain defect adversely impacts the data and signature corruption within the MISR.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

A method and apparatus for fault tolerant and flexible test signature generator within an integrated device are discussed. In the following description, for purposes of explanation, numerous details are set forth in order to provide a thorough understanding of the present invention. However, it will be apparent to one skilled in the art that these specific details are not required in order to practice the present invention.

Figure 1:
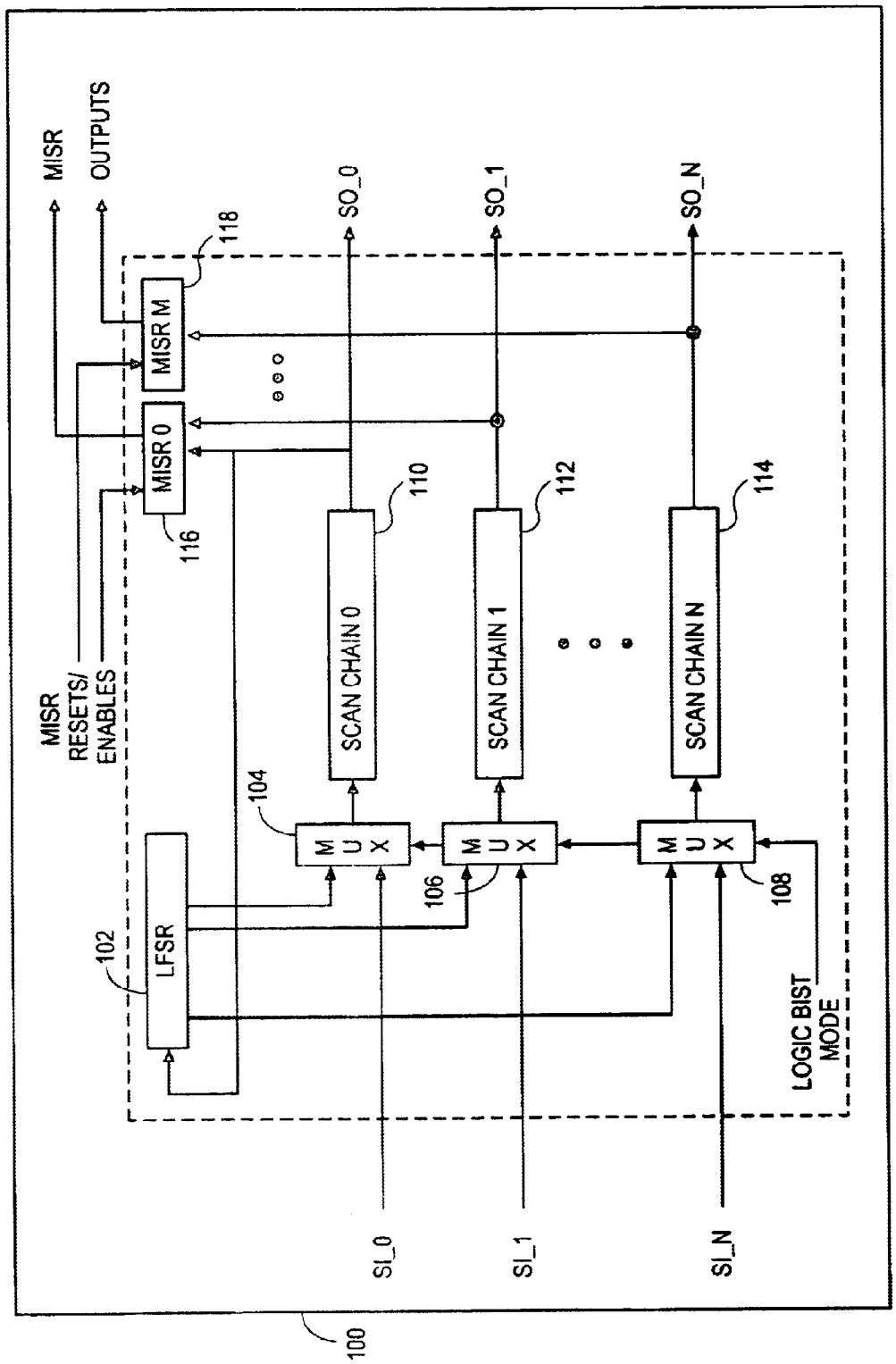
FIG. 1 illustrates a block diagram utilized by an embodiment of the present invention.

FIG. 1 illustrates a block diagram 100 utilized by an embodiment of the present invention. The block diagram 100 comprises a linear feedback shift register 102 (LFSR), a plurality of multiplexers 104–108 which individually select the input to a plurality of scan chains 110–114, and a plurality of multiple input signature registers 116–118 (MISR) is coupled to outputs of the plurality of scan chains. In one embodiment, each MISR is coupled to the output of each scan chain 110–114. In one embodiment, the MISRs 116–118 receive reset controls and are independently reset, which is discussed further in FIG. 2. In another embodiment, the MISRs 116–118 are simultaneously reset by a global reset signal or enabled by a global enable signal.

The LFSR 102 generates test patterns, which in one embodiment are forwarded to the plurality of scan chains via the multiplexers 104–108. In another embodiment, the test patterns from the LFSR are forwarded to the plurality of scan chains without the need for multiplexers 104–108. For the embodiment with the multiplexers 104–108, one example of the operation is the multiplexer 104 selects either the scan input signal SI_0 or the input from LFSR 102 and forwards the input to the scan chain 110. A control signal, Test Mode, instructs the multiplexer on which input to forward to the scan chain. In one embodiment, the Test Mode signal is a logic 1 and enables a logic built in self test mode (LBIST). If the Test Mode signal is a logic 1, the multiplexer 104 selects the LFSR 102 input to forward to the scan chain 110. The MISRs 116–118 receive inputs from the outputs of the plurality of scan chains 110–114 and are discussed further in FIG. 2. In one embodiment, the contents of the MISR are forwarded to automatic test equipment (ATE) in order to compare the expected test pattern results to the actual test pattern results stored in the MISR. In one embodiment, FIG. 1 resides on a single integrated device.

Figure 2:
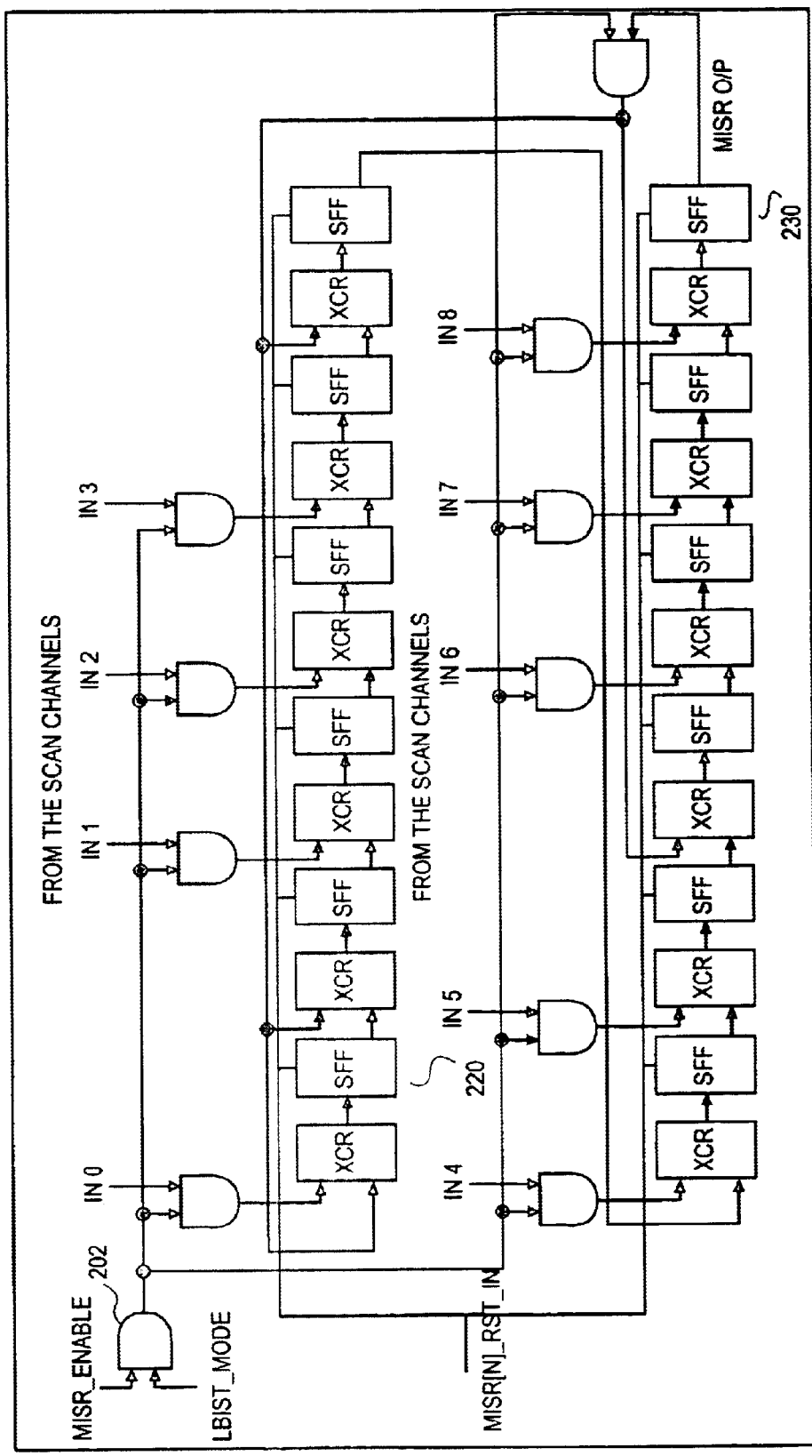
FIG. 2 illustrates a circuit diagram utilized by an embodiment of the present invention.

FIG. 2 illustrates a circuit diagram 200 utilized by an embodiment of the present invention. In one embodiment, circuit 200 is a gate level implementation of a single MISR from block diagram 100. A MISR(n)_rst_in signal initializes the MISR and is a first step to enable data capture. In one embodiment, a logical AND gate 202 receives an enable signal, MISR_ENABLE, and the Test Mode signal. In another example, the AND gate 202 is replaced by a multiplexer. For the embodiment with the logical AND gate 202, after the MISR is initialized by pulsing the MISR(n)_rst_in signal, the logical AND gate 202 enables the MISR's data capture feature and requires that both the MISR_ENABLE and Test Mode signal are a logic high, "1". Proceeding on, the MISR captures data into the plurality of flip flops 220–230 from the scan chains, specifically, from a plurality of signals, in0, in1, in2, in3, in4, in5, in6, in7, and in8. The plurality of XOR gates and flip flops(SFF) allow for an analysis of the polynomial received from the outputs of the scan chain, in0–in8. For example, the polynomial can be divided and the remainder analyzed to determine if there is a match with a signature. Based on simulation results, the signature indicates whether the device is properly functioning or is a defective integrated device. The plurality of XOR gates and flip-flops receive the signature and analyze it.

One skilled in the art appreciates the multiple possibilities of designing a gate level implementation of the MISR based on design constraints such as silicon die size, power requirements, polynomial specification, and design functionality specifications. For example, the size of the polynomial can be increased or decreased based on the number of input signals in0–in8. Also, the MISRs 116–118 each can have a separate clock or a global clock to disable the input capture capability. The logical AND gate 202 can be replaced with a multiplexer. Also, one can address the issue of aliasing by increasing the length of the MISR, which has the effect of minimizing the aliasing effect.

The circuit diagram 200 is in the data capture mode as previously discussed when the MISR has been initialized by pulsing MISR(n)__rst__in signal and the output of the AND gate 202 is a logic high. However, if a value from an un-initialized node propagates to the MISR input, the MISR data capture is disabled by setting the MISR__ENABLE signal to a logic zero, "0", for the clock cycle during which the value of the un-initialized node would have been captured in the MISR. In one embodiment, the clock cycle during which the value of the un-initialized node would have been captured, is determined by logic simulation software. Once the clock cycle of the un-initialized node has been determined, the MISR will be disabled from receiving an input one clock cycle before the un-initialized value is received by the MISR. Proceeding on, once the value of the un-initialized node is replaced with valid data, the date capture is enabled by setting the MISR__ENABLE signal to a logic one, "1". Thus, each MISR depicted in FIG. 1 can be independently controlled and reset.

FIG. 2 enables generating signatures despite the presence of values from un-initialized nodes. Also, since there are a plurality of MISRs, the invention allows for generating signatures if one of the MISRs are disabled. In one embodiment, each MISR receives inputs from the scan chains based on a respective clock domain, wherein the segregation of MISRs based on clock domains will allow generating signatures despite a corrupted clock domain. Thus, the invention allows for a flexible and fault tolerant test signature generation.

One skilled in the art would appreciate utilizing various embodiments. For example, each MISR can receive different numbers of inputs, specifically; MISR 116 can receive 8 inputs, while MISR 118 can receive 16 inputs from the scan chains. The invention is capable of supporting multiple variations of gate level implementations of the MISR. For example, a MISR with individual clock, reset, and disable controls can be controlled by logic or external pins. In contrast, the plurality of MISRs can be simultaneously reset or disabled by one global signal generated by logic or an external pin. Also, the invention can support MISRs with different polynomial sizes by the ability to add more logic and flip flops to store larger polynomials.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. An apparatus comprising:
   a generator to generate a pattern;
   a plurality of scan chains to receive the pattern from the generator; and
   a plurality of independently reset and enabled signature registers coupled to the plurality of scan chains, to receive an output of at least one of the plurality of scan chains during a mode of an integrated device, the plurality of signature registers to be simultaneously reset by a global signal and at least one signature register is disabled one clock cycle before a detection of an un-initialized node by the signature register, and the signature register is enabled once the value of the un-initialized logic node is replaced with a valid data.

2. The apparatus of claim 1 further comprising a plurality of multiplexers coupled to the generator and plurality of scan chains, to forward the pattern from the generator to the plurality of scan chains in response to a signal.

3. The apparatus of claim 2 wherein the signal is a built in self test activation.

4. The apparatus of claim 1 wherein the signature register comprises a plurality of flip flops to receive the output of the scan chains.

5. The apparatus of claim 1 wherein the mode of the integrated device is a state with at least one un-initialized logic node.

6. An integrated device comprising:
   a generator to generate a pattern;
   a plurality of scan chains to receive the pattern from the generator; and
   a configuration of a plurality of independently reset signature registers, that are reset by a global signal, and the configuration selects at least one signature register is coupled to a single clock domain of one scan chain, the configuration is coupled to a plurality of scan chains with respect to a clock domain of the scan chains, to receive an output of at least one of the plurality of scan chains during a mode of the integrated device, wherein at least one signature register is disabled one clock cycle before a detection of an un-initialized node, and the signature register is enabled once the value of the un-initialized logic node is replaced with a valid data.

7. The integrated device of claim 6 further comprising a plurality of multiplexers coupled to the generator and plurality of scan chains, to forward the pattern from the generator to the plurality of scan chains in response to a signal.

8. The integrated device of claim 7 wherein the signal is a built in self test activation.

9. The integrated device of claim 6 wherein the signature register comprises a plurality of flip flops to receive the output of the scan chains.

10. The integrated device of claim 6 wherein the mode of the integrated device is a state with at least one un-initialized logic node.

* * * * *